US011894315B2

(12) United States Patent
Sohier et al.

(10) Patent No.: US 11,894,315 B2
(45) Date of Patent: Feb. 6, 2024

(54) ELECTRONIC SYSTEM IN PACKAGE COMPRISING PROTECTED SIDE FACES

(71) Applicant: COMMISSARIAT A L'ENERGIE ATOMIQUE ET AUX ENERGIES ALTERNATIVES, Paris (FR)

(72) Inventors: Thibaut Sohier, Grenoble (FR); Stephan Borel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 48 days.

(21) Appl. No.: 17/450,571

(22) Filed: Oct. 12, 2021

(65) Prior Publication Data
US 2022/0115330 A1   Apr. 14, 2022

(30) Foreign Application Priority Data
Oct. 13, 2020   (FR) ..................... 20 10455

(51) Int. Cl.
| | | |
|---|---|---|
| H01L 23/552 | (2006.01) | |
| H01L 21/48 | (2006.01) | |
| H01L 21/56 | (2006.01) | |
| H01L 23/498 | (2006.01) | |
| H01L 25/065 | (2023.01) | |

(52) U.S. Cl.
CPC ........ *H01L 23/552* (2013.01); *H01L 21/4846* (2013.01); *H01L 21/56* (2013.01); *H01L 23/49838* (2013.01); *H01L 25/0655* (2013.01); *H01L 23/49827* (2013.01)

(58) Field of Classification Search
None
See application file for complete search history.

(56) References Cited

U.S. PATENT DOCUMENTS

| | | | | |
|---|---|---|---|---|
| 10,714,455 | B2 * | 7/2020 | Seidemann | ............. H01L 24/97 |
| 11,387,175 | B2 * | 7/2022 | Mallik | ..................... H01L 23/42 |
| 2007/0018334 | A1 * | 1/2007 | Peytavy | ........... G06K 19/07381 |
| | | | | 257/659 |
| 2017/0103968 | A1 | 4/2017 | Prabhu et al. | |
| 2020/0273811 | A1 * | 8/2020 | Mallik | ................ H01L 23/3114 |

OTHER PUBLICATIONS

French Preliminary Search Report dated Jul. 1, 2021, issued in French Application 20 10455 filed on Oct. 13, 2020, 2 pages (with English Translation of Categories of Cited Documents).

* cited by examiner

*Primary Examiner* — Long Pham
(74) *Attorney, Agent, or Firm* — Oblon, McClelland, Maier & Neustadt, L.L.P.

(57) ABSTRACT

An electronic system in package, including at least:
a support;
one or more chips mechanically and electrically coupled to a front face of the support;
an encapsulation material covering the front face of the support and encapsulating the chip(s);
several side protection elements, comprising an opaque material and laterally surrounding the chip(s) and configured to form a barrier at least against laser attacks made through side faces of the electronic system in package that are substantially perpendicular to the front face of the support; and wherein the side protection elements are disposed in the encapsulation material or in one or more first blocks of material distinct from the support and disposed in the encapsulation material.

6 Claims, 5 Drawing Sheets

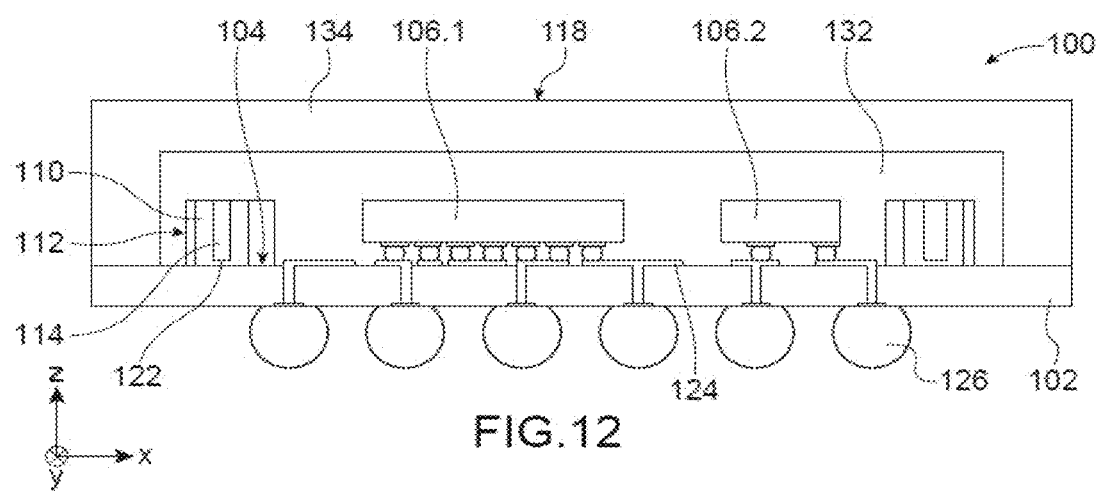

ELECTRONIC SYSTEM IN PACKAGE COMPRISING PROTECTED SIDE FACES

TECHNICAL FIELD

The invention relates to the field of protection of electronic Systems in package, or SiPs, against attacks implemented with the aim of accessing sensitive information stored in the system or damaging its operation. The invention is directed to an electronic system in package including means for protecting its side faces to prevent access to the integrated circuit(s) of the electronic system in package from these protected side faces.

STATE OF PRIOR ART

An electronic system in package, or SiP, corresponds to a set of chips, which are integrated circuits and/or which include other components (passive, MEMS, etc.), enclosed in a same package or module, arranged next to each other and/or on top of each other on a support, and electrically connected to each other and/or to connections external to the electronic system in package by wires and/or by flip-chip.

The face located on the side where the chips are disposed on the support will be referred to as the front face of the electronic package, regardless of the direction in which they are positioned on the support. The opposite face, that is the side on which the connections, for example connection balls, for attaching the electronic system in package onto a printed circuit board (PCB) are located, will be referred to as the rear face of the electronic package.

An electronic system in package can be attacked by software or hardware. In the second case, the attacks, known as physical attacks, can be carried out in various ways: chemical, laser, electromagnetic, electrical, etc.

Some attacks, known as non-invasive attacks or by auxiliary channels, do not involve an introduction into the electronic system under attack. These attacks consist in measuring data external to the electronic system in package: measurement of its power consumption, measurement of electromagnetic emissions emanating from the electronic system in package, measurement of heat emitted by the electronic system in package, etc.

Other attacks, known as semi-invasive attacks, involve a moderate introduction into the electronic system in package under attack, which remains operational or functional after these attacks, such as for example attacks by fault injection using a laser (light pulse). These attacks are carried out both from the front face and the rear face of the electronic system in package.

Finally, other attacks, known as invasive attacks, involve partially destroying the package under attack, such as probing attacks and reverse engineering. These attacks involve access and irreversible modification of the circuit, which may or may not remain functional after these attacks.

Laser or photoelectric attacks are currently the most common physical attacks perpetrated due to the widespread availability of tools for implementing these types of attacks. Most often, such an attack consists in exciting a region of the circuit of the electronic system in package that includes at least one transistor so as to make it change state. The laser used emits, for example, in the case of rear face attacks, in the near infrared. This unexpected change of state of the transistor induces errors, or faults, in the execution of one or more operations implemented in the circuit under attack. If these correspond to encryption/decryption operations, it is possible, by analysing the erroneous values obtained, to find information relating to the encryption key (that is the value of the bits that make it up) used by the circuit under attack.

To counter laser attacks from the front face of a chip or electronic system in package, it has especially been suggested to add diode-based light detectors to the front face. Other countermeasures, such as "anti-probing" layers, formed for example by a coil on which a continuous measurement of the electrical resistance is performed, make it possible to check that a region of the front face has not been damaged in order to form an access to the circuit for the laser beam.

Faced with increasingly effective front face protection, attackers have been lead to develop techniques for attacking the rear face of the device. Similar protection solutions have therefore also been provided at the rear face of chips or electronic systems in package.

Electromagnetic wave attacks generally consist in either performing fault injection into the components of the electronic system in package under attack via electromagnetic pulses, or deducing the value of bits making up an encryption key from observations of the electromagnetic field emitted by the system in operation. There are solutions to counter this type of attack, such as, for example, making an electromagnetic shielding on one or more faces of the electronic system in package or emitting parasitic electromagnetic waves in order to scramble the electromagnetic spectrum emanating from the electronic system in package.

The side faces of the electronic systems in package however remain vulnerable to attack as the solutions described above to protect the front and rear faces are not adapted to protect the side faces.

Document US 2007/018334 A1 describes a solution for protecting all faces of a system consisting of a PCB-attached BGA package, this solution using the electrical connections passing through the package as well as the connection balls of the package and also the PCB elements (conductor tracks in the horizontal plane and vertical through connections). However, this solution is not adapted to all types of systems in package. Indeed, the presence of electrical connections passing through the package is a specificity of the "cavity down" type packages as described in that document, whereas standard BGA packages generally do not have such connections. Furthermore, this solution is not optimal for protection against probing or electromagnetic wave attacks.

DISCLOSURE OF THE INVENTION

Thus there is a need to provide an electronic system in package whose side faces are protected at least against laser attacks, and whose side face protection means can be adapted to all types of electronic systems in package.

For this, one embodiment provides an electronic system in package, including at least:
  a support;
  one or more chips mechanically and electrically coupled to a front face of the support;
  electrical contact elements arranged at a rear face, opposite to the front face, of the support and electrically coupled to the chip(s);
  an encapsulation material covering the front face of the support and encapsulating or covering the chip(s), and/or a cover forming, at least with the support, at least one cavity in which the chip(s) are disposed;
  several side protection elements comprising at least one opaque material, laterally surrounding the chip(s) and configured to form a barrier at least against laser attacks made through side faces of the electronic system in package which are substantially perpendicular to the front face of the support;

and wherein the side protection elements are disposed in the encapsulation material or in one or more first blocks of material distinct from the support and disposed in the encapsulation material and/or between the support and the cover.

It is proposed to make several side protection elements in the encapsulation material (directly or in first blocks of material themselves disposed in the encapsulation material) and/or between the support and the cover (in first blocks of material disposed between the support and the cover) of the electronic system in package in order to form an opaque barrier protecting the chip(s) of the system in package against laser attacks, especially of the LLFI or "Lateral Laser Fault Injection" type.

Such protection elements can be made in any type of electronic system in package.

The side protection elements are not used for the transit of information, or useful signals, from the chip(s) of the electronic system in package.

The material of the side protection elements is referred to as opaque because a laser beam whose wavelength is for example between 360 nm and 1064 nm cannot pass therethrough.

The encapsulation material may also correspond to an opaque material, that is a material that through which a laser beam whose wavelength is, for example, between 360 nm and 1064 nm cannot pass.

The term "chip" refers here and throughout the document to a set of active and/or passive, electronic and/or electromechanical components (such as one or more MEMS). The electronic chip may correspond to an integrated circuit and/or may include other components (passive, MEMS, etc . . . ).

Advantageously, the material of the side protection elements may be electrically conductive. This configuration is very advantageous because the side protection elements form in this case, in addition to an optical barrier, an electromagnetic shielding allowing effective protection of the electronic system in package against electromagnetic attacks by preventing electromagnetic wave fault injection and reading of electromagnetic emissions emanating from the components of the electronic system in package. Furthermore, this configuration makes it possible to make the side protection elements active, that is to measure certain characteristic quantities thereof (resistance or impedance depending on the conditions, for example) allowing their integrity to be judged.

Advantageously, the material of the side protection elements may correspond to a magnetic material or to a combination of magnetic and non-magnetic materials.

Further to the side protection elements, the electronic system in package may include other opaque elements not forming part of the side protection of the electronic system in package.

The electronic system in package may further include at least one front protection layer of the electronic system in package, disposed in the encapsulation material, on the side of a front face of the electronic system in package and facing the chip(s), and comprising several portions of electrically conductive material extending in at least one plane parallel to the front face of the electronic system in package in at least one coil pattern.

Alternatively, the electronic system in package may include at least one front protection layer of the electronic system in package which is not electrically active, that is which does not include electrically conductive material or includes portions of electrically conductive material which are not electrically connected to each other and/or to the rest of the system.

The front protection layer of the electronic system in package may extend into one or more superimposed levels above the chip(s) of the electronic system in package.

The electronic system in package may further include a rerouting layer or redistribution layer, RDL, interposed between the front face of the support and the chip(s) and/or disposed at least partially in the support, and to which the chip(s) are electrically connected.

In this case, first portions of the redistribution layer may form electric connection elements electrically connecting at least part of the side protection elements to each other, and, when the electronic system in package includes the front protection layer, the side protection elements may be electrically connected to the portions of electrically conductive material of the front protection layer by forming one or more conduction paths whose electrical resistance or impedance, depending on whether the current flowing in the portions of electrically conductive material of the front protection layer of the electronic system in package and in the side protection elements is direct (for the electrical resistance) or alternating (for the impedance), can be measured. In this configuration, the front protection layer cooperates with the side protection elements to form an active protective cover preventing attacks from the chip(s) through the front and side faces of the electronic system in package.

The electronic system in package may further include connection elements electrically connecting the front protection layer to the redistribution layer, surrounded by the side protection elements and disposed in the encapsulation material or in at least one second block of material distinct from the support and disposed in the encapsulation material and/or between the support and the cover.

The connection elements may be made from the same material as the side protection elements. The connection elements may especially be used to electrically connect the front protection layer to the chip or one of the chips that measures the impedance or electrical resistance of the front protection layer of the system in package and the side protection elements.

Second portions of the redistribution layer may form at least one rear protection layer of the electronic system in package disposed facing the chip(s), said second portions of the redistribution layer being electrically connected to the side protection elements.

Thus, the front and rear protection layers of the electronic system in package and the side protection elements form a secure enclosure in which the chip(s) of the electronic system in package are disposed, protecting all faces of the electronic system in package.

Advantageously, at each of the side faces of the electronic system in package, the side protection elements can be disposed in a staggered manner and in several rows parallel to said side face of the electronic system in package. This arrangement of the side protection elements is advantageous because it makes it more difficult to make a wire diversion on the side elements and to access a laser beam between the side protection elements.

Another embodiment relates to a method for making an electronic system in package, including at least the following steps of:

mechanically and electrically coupling one or more chips to a front face of a support;

depositing an encapsulation material covering the front face of the support and encapsulating the chip(s), and/or making a cover forming, at least with the support, at least one cavity in which the chip(s) are disposed;

making electrical contact elements disposed at a rear face, opposite to the front face, of the support and electrically coupled to the chip(s);

and further including making several side protection elements comprising at least one opaque material, laterally surrounding the chip(s) and configured to form a barrier at least against laser attacks made through side faces of the electronic system in package that are substantially perpendicular to the front face of the support, the side protection elements being disposed in the encapsulation material or in one or more first blocks of material distinct from the support and disposed in the encapsulation material and/or between the support and the cover.

In addition, the side protection elements comprise at least one opaque material such that a laser beam whose wavelength is for example between 360 nm and 1064 nm cannot pass therethrough.

Making the side protection elements may include, after depositing the encapsulation material:
making cavities in the encapsulation material;
depositing the opaque material into the cavities, forming the side protection elements.

Alternatively, making the side protection elements may include, before depositing the encapsulation material and/or making the cover:
making cavities in a layer of material not integral with the support;
depositing the opaque material into the cavities, forming the side protection elements;
cutting out the layer of material, forming the first block(s) of material;
disposing the first block(s) of material on the support, around the chip(s);
and the encapsulation material can then be deposited covering the first block(s) of material and/or above which block(s) the cover is then made or disposed.

The method may further include, after the step of coupling the chip(s):
making at least one front protection layer of the electronic system in package on the side of a front face of the electronic system in package and facing the chip(s), the front protection layer comprising several portions of electrically conductive material extending in at least one plane parallel to the front face of the electronic system in package in at least one coil pattern.

The method may further include, prior to the step of coupling the chip(s), making a redistribution layer on the front face of the support and/or at least partly in the support, and wherein:
the chip(s) are subsequently electrically coupled to the redistribution layer;
the method includes a step of making connection elements electrically connecting the front protection layer to the redistribution layer, surrounded by the side protection elements and disposed in the encapsulation material or in at least one second block of material distinct from the support.

In this case, the steps implemented to make the side protection elements are advantageously also used to also make the connection elements, whether these are made directly in the encapsulation material or in blocks of material distinct from the support.

The material of the side protection elements may be electrically conductive, and first portions of the redistribution layer may form electric connection elements electrically connecting at least part of the side protection elements to each other, and the side protection elements may be electrically connected to the portions of electrically conductive material of the front protection layer by forming one or more conduction paths whose impedance or electrical resistance can be measured.

Another embodiment relates to a method for making several electronic systems in package, wherein each of the electronic systems in package is made by implementing the steps of a method as described above, and wherein in each of the electronic systems in package, the electric connection elements are arranged in several first blocks of material and form, together with the side protection elements and the portions of electrically conductive material of the front protection layer, conduction paths different from one electronic system in package to the other.

BRIEF DESCRIPTION OF THE DRAWINGS

The present invention will be better understood upon reading the description of exemplary embodiments given purely by indicative and in no way limiting purposes, with reference to the appended drawings in which:

FIG. 12 schematically shows an electronic system in package according to a fourth embodiment.

Identical, similar or equivalent parts of the various figures described below bear the same reference numerals so as to facilitate switching from one figure to another.

Figure 1:
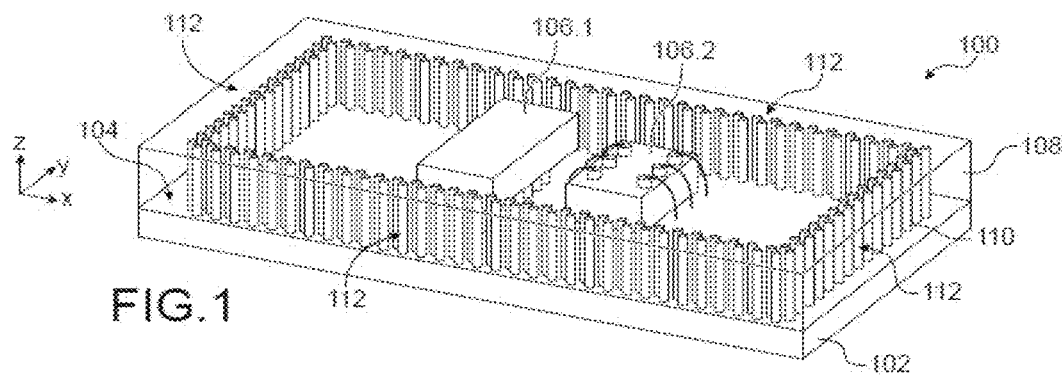
FIGS. 1 to 3 schematically show an electronic system in package according to a first, second and third embodiment respectively.

The various parts shown in the figures are not necessarily represented on a uniform scale, in order to make the figures more legible.

The various possibilities (alternatives and embodiments) are to be understood as not being exclusive of each other and can be combined with each other.

DETAILED DISCLOSURE OF PARTICULAR EMBODIMENTS

An electronic system in package 100 according to a first embodiment is described below in connection with FIG. 1.

The electronic system in package 100 includes a support 102 corresponding to, for example, a semiconductor substrate such as silicon or a ceramic or metal or organic substrate.

The electronic system in package 100 also includes chips mechanically and electrically coupled to a front face 104 of the support 102. In the exemplary embodiment shown in FIG. 1, the electronic system in package 100 includes a first chip bearing reference 106.1 and mechanically and electrically coupled to the front face 104 by flip-chip bonding, and a second chip bearing reference 106.2 whose electrical coupling with the front face 104 is achieved by wire cabling.

Alternatively, it is possible for the electronic system in package 100 to include a larger number of chips mechanically and electrically coupled to the front face 104 of the support 102, or alternatively a single chip mechanically and electrically coupled to the front face 104 of the support 102.

The system in package 100 also includes an encapsulation material 108 covering the front face 104 of the support 102 and encapsulating the chips 106.1, 106.2. The encapsulation material 108 corresponds, for example, to a resin.

The system in package 100 also includes several side protection elements 110 comprising an opaque material, laterally surrounding the chips 106.1, 106.2 and configured to form a barrier at least against laser attacks made through side faces 112 of the electronic system in package 100 which are substantially perpendicular to the front face 104 of the support 102. In the example shown in FIG. 1, each side protection element 110 has the shape of a pillar disposed on the front face 104 of the support 102, and includes a cross-section, in a plane parallel to the front face 104 of the support 102 (plane parallel to the (X,Y) plane of FIG. 1), for example circular, oval, polygonal, etc. Each side protection element 110 has, for example, a diameter of between approximately 10 μm and 100 μm.

In the first embodiment shown in FIG. 1, the side protection elements 110 are disposed directly in the encapsulation material 108, that is formed in cavities passing through the encapsulation material 108.

In order to ensure proper side protection of the chips 106.1, 106.2, the height (dimension along the axis Z and perpendicular to the front face 104 of the support 102) of each side protection element 110 is at least equal to that of the chips 106.1, 106.2 so that these side protection elements 110 form a barrier at the sides of the electronic system in package 100.

The material of the side protection elements 110 advantageously corresponds to an electrically conductive material, which makes it possible to form a protection barrier against laser attacks but also against electromagnetic wave attacks. This electrically conductive material can advantageously correspond to a magnetic material, as for example NiFe or CoZaTr, or to a combination of magnetic and non-magnetic materials allowing the use of a GMI (Giant MagnetoImpedance) type effect. The use of a magnetic material to form at least part of the side protection elements 110 improves effectiveness of the electromagnetic shielding achieved by the elements 110.

Alternatively, it is possible that this opaque material of the side protection elements is not electrically conductive, such as a polymeric material. In this case, the protection barrier formed by the side protection elements protects the chips 106.1, 106.2 against laser attacks, but not against electromagnetic wave attacks.

The side protection elements 110 comprise an opaque material such that a laser beam whose wavelength is between 360 nm and 1064 nm cannot pass therethrough.

In FIG. 1, at each of the side faces 112 of the electronic system in package 100, the side protection elements 110 are disposed in a staggered manner and in several rows (two in FIG. 1) parallel to said side face 112 of the electronic system in package 100. Such a configuration forms an additional obstacle against an attack which would be made through the side faces of the electronic system in package 100.

Although not visible in FIG. 1, the electronic system in package 100 also includes electrical contact elements arranged at a rear face, opposite to the front face 104, of the support 102 and electrically coupled to the chips 106.1, 106.2.

Figure 2:
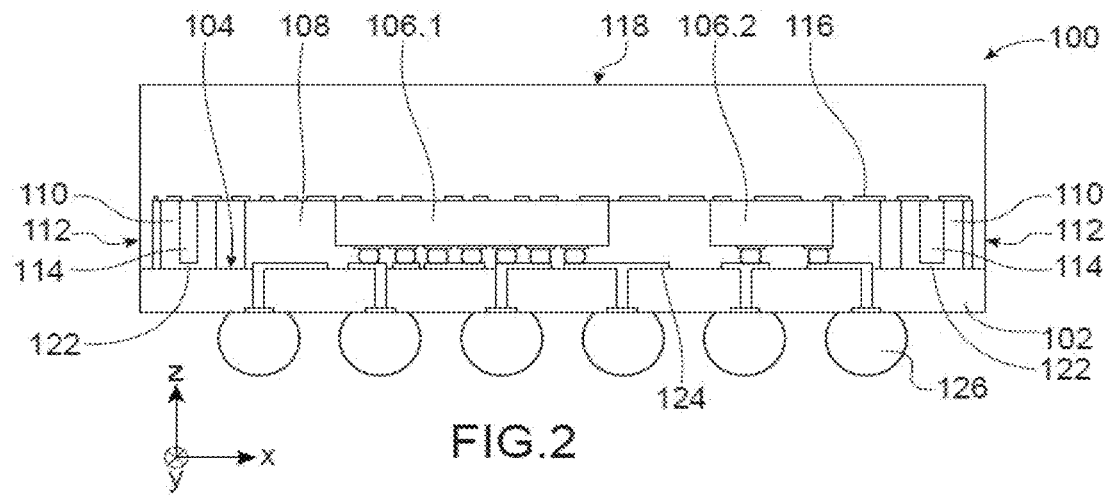

An electronic system in package 100 according to a second embodiment is described below in connection with FIG. 2.

As in the first embodiment, the electronic system in package 100 includes the support 102, the chips 106.1 and 106.2 mechanically and electrically coupled to the front face 104 of the support 102, the encapsulation material 108 and the side protection elements 110.

With respect to the first embodiment, the side protection elements 110 of the electronic system in package 100 according to the second embodiment are not made directly in the encapsulation material 108, but are disposed in first blocks 114 of material distinct from the support 102 and disposed in the encapsulation material 108. The material of the first blocks 114 corresponds for example to a semiconductor such as silicon. Alternatively, the material of the first blocks 114 may correspond to an opaque material such as polymer.

The electronic system in package 100 according to the second embodiment further includes a front protection layer 116 disposed in the encapsulation material 108 on the side of a front face 118 of the electronic system in package 100 and facing the chips 106.1, 106.2. The front protection layer 116 comprises several portions of electrically conductive material extending in at least one plane parallel to the front face 118 of the electronic system in package 100 in at least one coil pattern. The front protection layer 116 is also parallel to the front face 104 of the support 102.

Furthermore, the electronic system in package 100 according to the second embodiment further includes electric connection elements 122 disposed between the support 102 and the side protection elements 110. Each of the electric connection elements 122 electrically connects at least part of the side protection elements 110 to each other.

The side protection elements 110, when electrically conductive, may also be electrically connected, at their apexes, to portions of electrically conductive material of the front protection layer 116 by forming one or more conduction paths whose impedance or electrical resistance can be measured: when the side protection elements 110 and the front protection layer 116 have a direct electric current flowing therethrough, the electrical resistance of this or these conduction path(s) is measured, and when this current is alternating, the impedance of this or these conduction path(s) is measured.

Thus, the side protection elements 110 form, together with the front protection layer 116, an assembly whose integrity can be checked by measuring the value of the resistance(s) or impedance(s) of the conduction path(s) formed.

Figure 4:
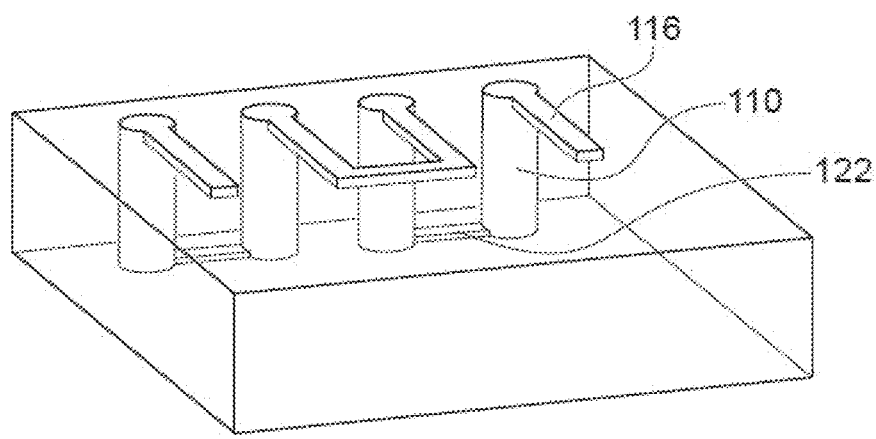
FIG. 4 schematically shows several connection elements electrically connecting side protection elements of an electronic system in package according to one embodiment.

FIG. 4 schematically shows several side protection elements 110 electrically coupled two by two by electric connection elements 122. The apexes of the side protection elements 110 are electrically coupled to portions of electrically conductive material of the front protection layer 116.

The system in package 100 according to the second embodiment further includes a redistribution layer 124 interposed between the front face 104 of the support 102 and the chips 106.1, 106.2 and/or disposed at least partly in the support 102, and to which the chips 106.1, 106.2 are electrically connected. This redistribution layer 124 ensures electric connections between the chips 106.1, 106.2 as well as those between the chips 106.1, 106.2 and electrical contact elements 126 of the system in package 100 which correspond, in the example shown in FIG. 2, to solder balls. In the case where the side protection elements 110 are made directly in the encapsulation material 108, the electric connection elements 122 correspond to portions of the redistribution layer 124. In the case where the side protection elements 110 are made in blocks 104 of material distinct from the support, these electric connection elements 122 may be integral parts of said blocks 104 or again correspond to portions of the redistribution layer 124.

Figure 3:
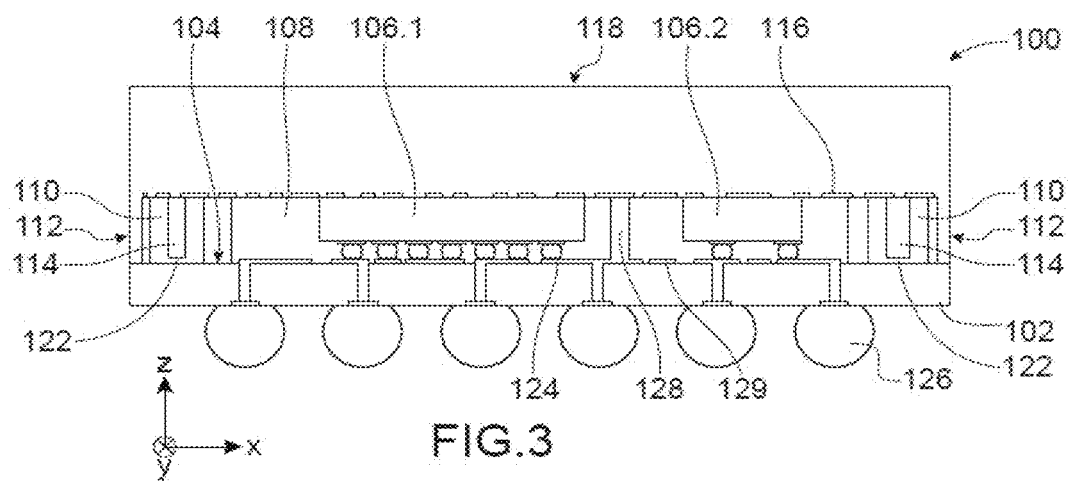

A system in package 100 according to a third embodiment is described below in connection with FIG. 3.

The system in package 100 according to this third embodiment includes all the elements of the system in package 100 according to the second embodiment previously described. However, the system in package 100 according to the third embodiment also includes connection elements 128 electrically connecting the front protection layer 116 to the redistribution layer 124. In FIG. 3, only one connection element 128 is shown. The connection elements 128 are for example disposed between the chips 106.1, 106.2. More generally, the connection elements 128 are surrounded by the side protection elements 110 and are disposed in the encapsulation material 108 or between the support and the cover.

The connection elements 128 advantageously include a material similar to that of the side protection elements 110, and may have a similar shape and similar dimensions to those of the side protection elements 110. Connection elements similar to the connection elements 128 may also be used as an internal protection of the system in package 100, by forming a shield around some parts of the system in package 100 that should not receive electromagnetic waves from other parts of the system in package 100.

According to another alternative, the connection elements 128 may be disposed in at least one second block of material distinct from the support 102 and disposed in the encapsulation material 108, in a manner similar to the side protection elements 110. In this alternative, when the material of the second block(s) of material corresponds to silicon, the connection elements 128 may correspond to through-silicon vias (TSV).

In the first and second embodiments previously described, the electrical contact elements 126 facing the chips 106.1, 106.2 also ensure protection for the rear face of the electronic system in package 100. In the exemplary embodiment shown in FIG. 3, portions of the redistribution layer 124 form a rear protection layer 129 of the electronic package 100, on the side opposite to the front face 118, this rear protection layer 129 being distinct from the electrical contact elements 126.

Advantageously, the side protection elements 110 are also electrically connected to the rear protection layer 129. Thus, the side protection elements 110, the front protection layer 116 and the rear protection layer 129 form an overall protection at all faces of the electronic system in package 100, protecting all faces of the chips 106.1, 106.2. The presence of this rear protection layer 129 provides improved protection as compared to the presence of the electrical contact elements 126 alone.

A method for making the electronic system in package 100 is described below in connection with FIGS. 5 to 8.

Figure 5:
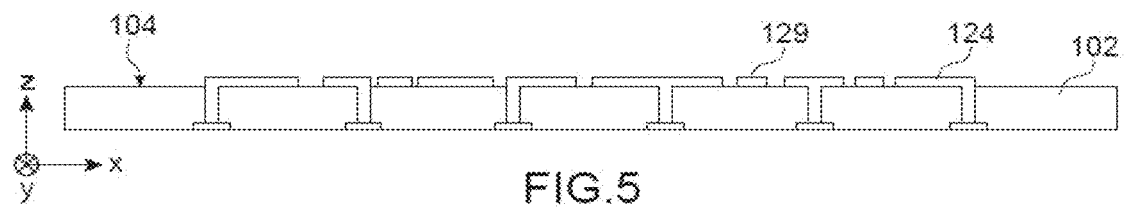
FIGS. 5 to 8 show a part of the steps of a method for making an electronic system in package according to one embodiment.

The redistribution layer 124 is first made on the support 102 (FIG. 5). In the exemplary embodiment described here, the support 102 corresponds to a substrate. For this, a metal layer is deposited onto the front face 104 of the support 102, and then a photolithography step and an etching step are implemented so that the remaining portions of the metal layer form the redistribution layer 124. As is visible in FIG. 5, conductive portions pass through the support 102 so that subsequently, the electrical contact elements 126 that will be made on the side of the rear face of the support 102 are electrically coupled to the redistribution layer 124.

Alternatively, the redistribution layer 124 may be at least partly formed in the support 102.

Portions of the redistribution layer 124 are not used to form electrical connections to the chips of the system in package 100, but are used to form a rear protection layer 129 on the side opposite to the front face 118 of the system in package 100. For this, the photolithography step is implemented by including the pattern of these portions forming the rear protection layer 129.

When the side protection elements 110 are to be made in first blocks 114 and not directly in the encapsulation material 108, these elements 110 are made in the first blocks 114 prior to depositing the encapsulation material 108. For this, a layer of material, for example a semiconductor substrate such as silicon, is used. Cavities are made in this layer of material, for example by etching, forming locations for the elements 110. The opaque material for forming the elements 110 is then deposited (for example by electrochemical deposition, screen printing, vacuum lamination . . . ) in the cavities. The opaque material deposited outside the cavities may be removed, for example by polishing. The layer of material is then cut out to form the blocks 114 including the side protection elements 110.

Figure 6:
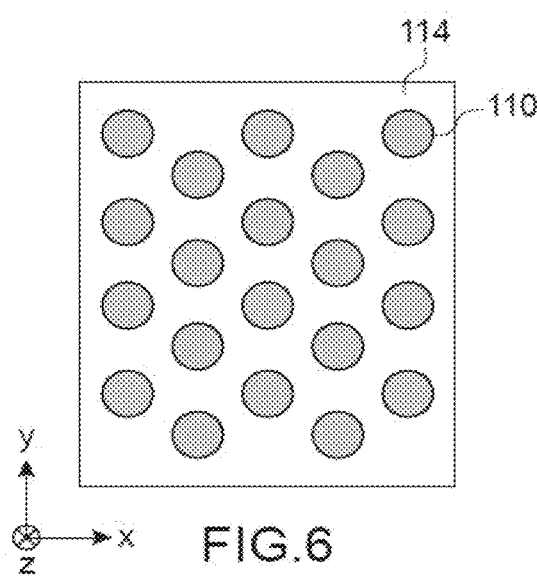

Advantageously, the side protection elements 110 are made such that in each block 114 they are arranged in a staggered manner in several parallel rows. FIG. 6 schematically shows part of a block 114 in which five rows of side protection elements 110 are formed.

Figure 7:
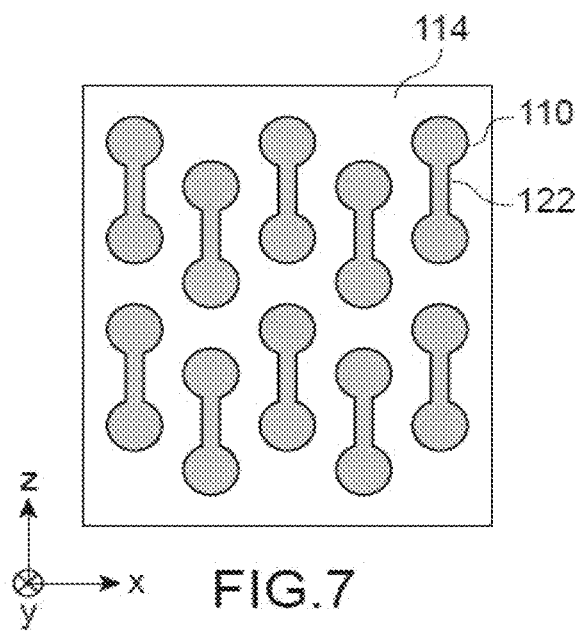

Prior to cutting out the layer used to form the first blocks 114, electric connection elements 122 to be disposed between the support 102 and the side protection elements 110 and to electrically connect at least part of the side protection elements 110 to each other are made at a face of the layer forming the blocks 114 where the side protection elements are electrically accessible. These electric connection elements 122 are formed by depositing a layer of conductive material and then by performing photolithography and etching so that remaining portions of this layer of conductive material form the electric connection elements 122. They may also be made at the same time as the side protection elements 110 by electroplating in the presence of a resin mask. FIG. 7 schematically shows the part of the block 114 visible in FIG. 6, with the electric connection elements 122 which have been made on the face of the block 114 to be subsequently placed against the support 102.

Figure 8:
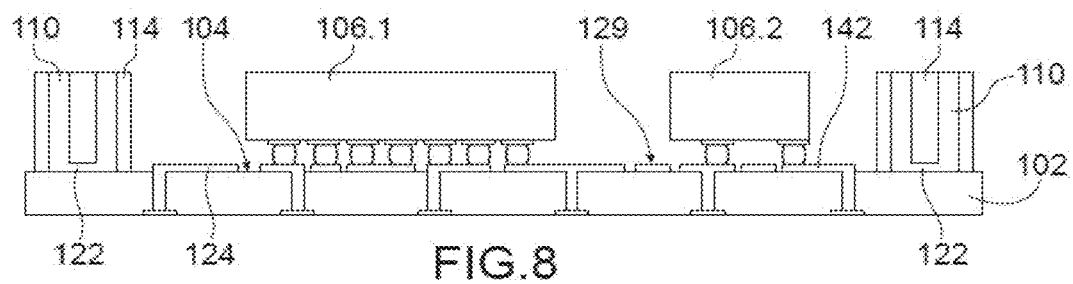

As shown in FIG. 8, the chips 106.1, 106.2 are mechanically and electrically coupled to the front face 104 of the support 102. The first blocks 114 are also coupled to the front face 104 of the support 102 around the chips 106.1, 106.2. By being disposed on the front face 104 of the support 102, the connection elements 122 form portions of the rear protection layer 129. When the system in package 100 includes one or more connection elements 128 made of second blocks of material distinct from the support 102, these second blocks are also coupled to the front face 104 of the support 102 prior to depositing the encapsulation material 108 and/or making the cover.

When the system in package 100 does not include a front protection layer 116, the encapsulation material 108 is then deposited onto the front face 104 of the support 102 so as to cover the chips 106.1, 106.2 and the first blocks 114 in which the side protection elements 110 have been made.

According to one exemplary embodiment, when the system in package 100 is to include the front protection layer 116, a first part of the encapsulation material 108 is deposited and then planarised with a stop on the first blocks 114 (and possibly the second blocks) so that apexes of the side protection elements 110 (and possibly the connection element(s) 128) are electrically accessible. The front protection layer 116 is then made on the first part of the encapsulation material 108 facing the chip(s) 106.1, 106.2. Making this front protection layer 116 especially includes depositing a layer of electrically conductive material and then lithography and etching of this layer of electrically conductive material. The lithography and etching are especially implemented in such a way that the remaining portions of this layer of electrically conductive material, after etching, form the desired protection pattern, for example, one or more coils, and also such that the side protection elements 110 are electrically connected to the portions of electrically conductive material of the front protection layer 116 by forming one or more conduction paths whose impedance or electrical resistance can be measured.

A second part of the encapsulation material is then deposited, especially covering the front protection layer 116, thus completing formation of the layer of encapsulation material 108.

In an alternative of the method described above, when the side protection elements 110 are to be directly made in the encapsulation material 108, which may be opaque, cavities forming the locations of the side protection elements 110 are etched into the encapsulation material 108, after depositing the same, for example by plasma or laser etching. The opaque material for forming the side protection elements 110 is then deposited into these cavities. The material deposited outside these cavities can be removed by implementing planarisation with a stop on the encapsulation material 108.

Advantageously, when the side protection elements 110 are made in the first blocks 114, the electric connection elements 122 that electrically connect at least part of the side protection elements 110 to each other are arranged differently in each of the first blocks 114. This configuration makes it possible to obtain a different current flow in the side protection elements 110 and thus different impedance values, thus bringing a difference to the impedance value of the electrical circuit formed by the side protection elements 110.

Figure 9:
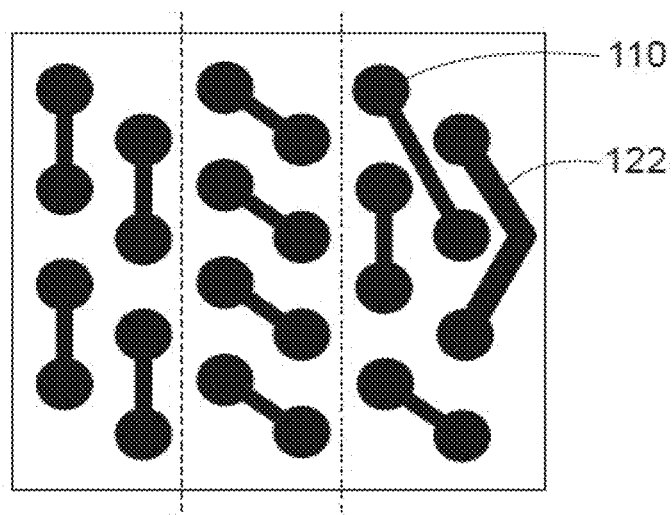
FIGS. 9 to 11 show steps implemented to make connection elements electrically connecting side protection elements according to an advantageous configuration.
Figure 10:
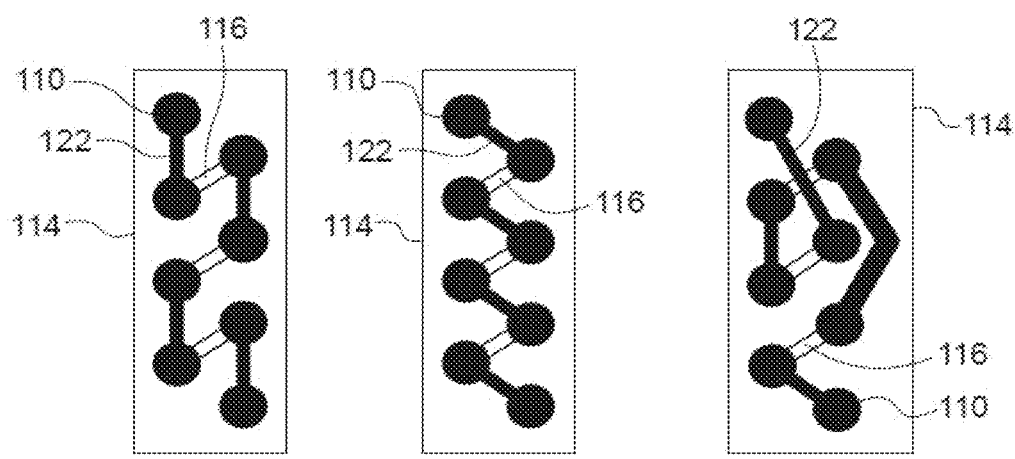
Figure 11:
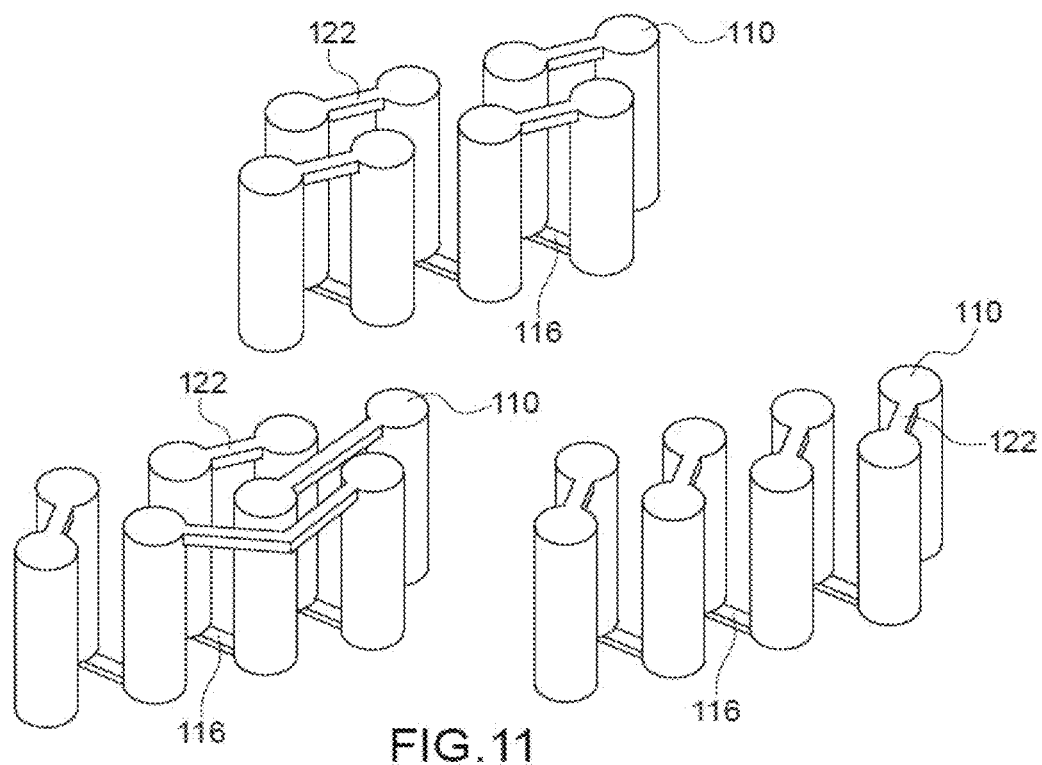

Such a configuration is obtained, for example, by first performing lithography and etching to define irregularly arranged electric connection elements 122 in the layer of material used to make the first blocks 114. Such a configuration is schematically shown in FIG. 9 for part of the layer of material used. First blocks 114 with different designs are then cut out of this layer, and then attached in order to achieve particularisation between the different modules 100. FIG. 10 shows three examples of first blocks 114 obtained from the part of the layer of material visible in FIG. 9. Upon making the front protection layer 116, the conduction paths formed by the side protection elements 110, the electric connection elements 122 and the conductive portions of the front protection layer 116 are different from one first block 114 to the other, as is visible for the first blocks 114 shown in FIG. 11. In this way, by attaching first blocks 114 with different cut-outs into the different systems in package 100, different conduction paths from one system in package 100 to the other and thus particularisation of the protection structures are obtained, which enhances effectiveness thereof.

In the previously described embodiments, the electric connection elements 122 which electrically connect the side protection elements 110 to each other are disposed between the support 102 and the side protection elements 110. Alternatively, it is possible that these electric connection elements 122 are disposed at the same level as the front protection layer 116.

An electronic system in package 100 according to a fourth embodiment is described below in connection with FIG. 12.

In contrast to the previously described embodiments in which the side protection elements 110 are disposed either directly in the encapsulation material 108 or in the first blocks 114 which are themselves disposed in the encapsulation material 108, the system in package 100 according to the fourth embodiment does not include an encapsulation material 108. The chips 106.1, 106.2 are here disposed in a cavity 132 formed between the support 102 and a cover 134 resting on the support 102. The first blocks 114 are also disposed in the cavity 132.

In an alternative of this fourth embodiment, the electronic system in package 100 includes the cover 134 and also the encapsulation material 108. In this case, the system in package 100 is made as previously described in connection with FIGS. 5 to 8, with the encapsulation material 108 made such that it encapsulates the chips 106.1, 106.2. Subsequently, the cover 134 is attached to the assembly previously made, by covering the encapsulation material 108, and is secured to the support 102.

In the previously described embodiments, the electrical contact elements 126 of the system in package 100 correspond to solder balls. Alternatively, the system in package 100 may include electrical contact elements 126 of a type other than balls, for example pins, tabs, etc.

The invention claimed is:
1. An electronic system in package, including at least:
a support;
one or more chips mechanically and electrically coupled to a front face of the support;
electrical contact elements disposed at a rear face, opposite to the front face, of the support, and electrically coupled to the one or more chips;
an encapsulation material covering the front face of the support and encapsulating the chip(s), and/or a cover forming, at least with the support, at least one cavity in which the chip(s) are disposed; and
several side protection elements, laterally surrounding the chip(s) and configured to form a barrier at least against laser attacks made through side faces of the electronic system in package which are substantially perpendicular to the front face of the support;
wherein the side protection elements are disposed in the encapsulation material or in one or more first blocks of material distinct from the support and disposed in the encapsulation material and/or between the support and the cover;
wherein the side protection elements comprise at least one opaque material such that a laser beam whose wavelength is between 360 nm and 1064 nm cannot pass therethrough;
wherein the side protection elements include at least one electrically conductive material; and
wherein the electronic system in package further includes at least one front protection layer of the electronic system in package, disposed in the encapsulation material, on the side of a front face of the electronic system in package and facing the chip(s), and comprising several portions of electrically conductive material extending in at least one plane parallel to the front face of the electronic system in package in at least one coil pattern.

2. The electronic system in package according to claim 1, further including a redistribution layer interposed between the front face of the support and the chip(s) and/or disposed at least partly in the support, and to which the chip(s) are electrically connected.

3. The electronic system in package according to claim 2, wherein first portions of the redistribution layer form electric connection elements electrically connecting at least part of the side protection elements to each other, and wherein, when the electronic system in package includes the front protection layer, the side protection elements are electrically connected to the portions of electrically conductive material of the front protection layer by forming one or more conduction paths whose impedance or electrical resistance can be measured.

4. The electronic system in package according to claim 1, further including a redistribution layer interposed between the front face of the support and the chip(s) and/or disposed at least partly in the support, and to which the chip(s) are electrically connected, and further including connection elements electrically connecting the front protection layer to the redistribution layer, surrounded by the side protection elements and disposed in the encapsulation material or in at least one second block of material distinct from the support and disposed in the encapsulation material.

5. The electronic system in package according to claim 2, wherein second portions of the redistribution layer form at least one rear protection layer of the electronic system in package facing the chip(s), said second portions of the redistribution layer being electrically connected to the side protection elements.

6. The electronic system in package according to claim 1, wherein, at each of the side faces of the electronic system in package, the side protection elements are disposed in a staggered manner and in several rows parallel to said side face of the electronic system in package.

* * * * *